United States Patent
Senoo

(10) Patent No.: US 11,495,297 B2
(45) Date of Patent: Nov. 8, 2022

(54) SEMICONDUCTOR DEVICE AND READING METHOD THEREOF

(71) Applicant: Winbond Electronics Corp., Taichung (TW)

(72) Inventor: Makoto Senoo, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 56 days.

(21) Appl. No.: 17/330,939

(22) Filed: May 26, 2021

(65) Prior Publication Data
US 2021/0375367 A1    Dec. 2, 2021

(30) Foreign Application Priority Data

May 27, 2020 (JP) .............................. JP2020-091995

(51) Int. Cl.
| | |
|---|---|
| *G11C 7/00* | (2006.01) |
| *G11C 16/10* | (2006.01) |
| *G11C 16/26* | (2006.01) |
| *G11C 16/34* | (2006.01) |
| *G11C 16/24* | (2006.01) |
| *G11C 16/08* | (2006.01) |

(52) U.S. Cl.
CPC ............ *G11C 16/102* (2013.01); *G11C 16/08* (2013.01); *G11C 16/24* (2013.01); *G11C 16/26* (2013.01); *G11C 16/3459* (2013.01)

(58) Field of Classification Search
CPC ....... G11C 7/1051; G11C 7/22; G11C 7/1072; G11C 7/1006; G11C 7/1066

USPC .......................... 365/189.15, 189.14, 185.18
See application file for complete search history.

(56) References Cited

U.S. PATENT DOCUMENTS

| 10,643,713 | B1* | 5/2020 | Louie .................... G11C 16/26 |
| 2019/0066818 | A1 | 2/2019 | Lee et al. |
| 2019/0348122 | A1* | 11/2019 | Ko .......................... G11C 16/26 |
| 2020/0160906 | A1* | 5/2020 | Lee ........................ G11C 16/26 |

FOREIGN PATENT DOCUMENTS

| CN | 101809671 A | 8/2010 |
| JP | 6103787 B1 | 3/2017 |
| TW | I356417 B | 1/2012 |
| TW | I378456 B | 12/2012 |

* cited by examiner

*Primary Examiner* — Son T Dinh
(74) *Attorney, Agent, or Firm* — Birch, Stewart, Kolasch & Birch, LLP

(57) ABSTRACT

A semiconductor device that can compensate for threshold fluctuations in memory cells using capacitive coupling. The flash memory includes a NAND-type memory cell array, a programing device, a reading device, and an offset voltage determining unit. The programing device programs the memory cells connected to a selected word line. The reading device reads the memory cells connected to a selected word line. The programing device programs the memory cells of a monitoring NAND string simultaneously when programing a word line. The reading device comprises a current detecting unit applying a read voltage to an unselected word line n+1, and detecting the current of the monitoring NAND string. The offset voltage determining unit determines the first and second offset voltage based on the detected current, and a reading pass voltage is applied to the unselected word line, a read voltage is applied to the selected word line.

18 Claims, 7 Drawing Sheets

SEMICONDUCTOR DEVICE AND READING METHOD THEREOF

CROSS REFERENCE TO RELATED APPLICATIONS

This Application claims priority of Japanese Patent Application No. 2020-091995, filed on May 27, 2020, the entirety of which is incorporated by reference herein.

BACKGROUND OF THE INVENTION

Field of the Invention

The present invention relates to a semiconductor memory device such as a NAND flash memory, and, in particular, to a method of reading a memory cell array.

Description of the Related Art

When reading or programing a page in a NAND flash memory, the operation of a word line is separated into even-number pages and odd-number pages. This is done to suppress noise caused by capacitive coupling between bit lines. However, as memory cells become more highly integrated, the effects of FG (Floating Gate) coupling between memory cells cannot be ignored. For example, when data "0" is programmed into the memory cell Ma of an even page, and as the threshold value of the memory cell Ma rises, the threshold value of the memory cell Mb of the odd page adjacent to the memory cell Ma rises due to the FG coupling with the memory cell Ma. Next, when data "0" is programmed into the memory cell Mb of an odd page, and as the threshold value of the memory cell Mb rises, the threshold value of the memory cell Ma rises due to the FG coupling with the memory cell Mb. In this way, the threshold value of the memory cell Ma rises due to the FG coupling with the memory cell Ma after the program has been verified. The margin of turning on the memory cell Ma becomes small during a read operation, and the operation becomes unstable. (Patent Document 1)

RELATED ART DOCUMENTATION

Patent Documentation

Patent Documentation 1: JP6103787B1

BRIEF SUMMARY OF THE INVENTION

In the read operation of a flash memory, the read margin of a memory cell may fluctuate due to the FG coupling with the memory cell of the adjacent unselected word line. For example, whether or not the adjacent unselected word line n+1 has already been programmed has a great influence on the read margin when reading a selected word line n.

The aforementioned phenomenon is especially true when the page is programmed in ascending order from the smallest word line number (the word line number connected to each memory cell of the NAND string increases from the source line side to the bit line side). For example, when programming the selected word line n, since the word line n+1 is still in the erased state, the threshold value Vt of the memory cell n of the selected word line n is almost unaffected by the FG coupling with the memory cell n+1 of the unselected word line n+1 during program verification of the selected word line n. On the other hand, when the word line n+1 has been programmed, the threshold value Vt of the memory cell n of the selected word line n will be seriously affected by the FG coupling with the memory cell n+1 of the unselected word line n+1 when the selected word line n is read.

In the read operation, although the reading pass voltage VPASSR is applied to an unselected word line, and the read voltage VREAD is applied to a selected word line, the memory cell is not sufficiently turned on by the read voltage VREAD when the threshold value Vt of the memory cell n of a selected word line n that is in the erased state increases due to the FG coupling with the memory cell of the unselected word line n+1. At worst, this may lead to a situation where the memory cell n does not turn on. As a result, the data in the memory cell n in the erased state cannot be read accurately, and the reliability of the flash memory decreases.

FIG. 1 is a time chart of the read operation of a conventional NAND flash memory. During the precharge period tPRE, a reading pass voltage VPASSR is applied to the selected word line and the unselected word line. The bit line side select transistor SEL_D is turned on by the gate voltage VSGD. The source line side selection transistor SEL_S is turned off by the gate voltage 0V. The bit line and the NAND string in the selected block are precharged by voltage. Next, during the discharge period tDIS, a read voltage VREAD (for example, 0.2 V) is applied to the selected word line. The source line side selection transistor SEL_S is turned on by the gate voltage VSGS. When the selected memory cell is in the programmed state, the electric potential of the bit line does not change because the NAND string is not conductive. When the selected memory cell is in the erased state, however, the NAND string is conductive and the electric potential of the bit line decreases. Next, during the sensing period tSEN, the page buffering/sensing circuit detects the electric potential of the clamped bit line to determine whether the selected memory cell is in the programmed state (data "0") or the erased state (data "1").

The broken line A shows the electric potential of the bit line when the selected memory cell is programmed, the solid lines B and C show the electric potential of the bit line when the selected memory cell is erased. Solid line B is an example in which the threshold value Vt increases due to FG coupling with the programmed memory cell n+1 of the unselected word line n+1, and solid line C is an example in which the memory cell of the word line n+1 is in the erased state and is not affected by the FG coupling.

In this way, when the memory cell n+1 of the unselected word line n+1 is programmed, because the threshold value Vt of the memory cell n in the erased state of the selected word line n shifts in the positive direction, during the discharge period tDIS, sufficient current was unable to flow through the memory cell n and as a result, the electric potential of the bit line did not decrease sufficiently as shown by the solid line B, and the difference from the electric potential of the bit line of the programmed memory cell (dashed line A) becomes small. That is, the read margin becomes small, and the memory cell in the erased state may be mistakenly determined as the memory cell in the programmed state.

The purpose of the present disclosure is to solve this conventional problem by providing a semiconductor memory device and a reading method capable of compensating for fluctuations in the threshold value Vt of a memory cell using capacitive coupling.

The reading method for semiconductor memory devices according to the present invention comprises the following steps. The first step is to prepare at least one monitoring NAND string for each block of a NAND-type memory cell array. The second step is to program a memory cell of the monitoring NAND string when programming a memory cell of a selected word line. The third step is to detect whether the memory cell of the unselected word line n+1 of the monitoring NAND string is programmed. This is done while reading the memory cell of the selected word line n. The fourth step is to determine the first offset voltage added to the reading pass voltage, and to determine the second offset voltage added to the read voltage, based on the detecting result of the third step. The fifth step is to apply the reading pass voltage (to which the first offset voltage has been added) to the unselected word line, and to apply the read voltage (to which the second offset voltage has been added) to the selected word line n.

The semiconductor memory device according to the present invention comprises a NAND-type memory cell array, a programming device, and a reading device. The NAND-type memory cell array comprises a plurality of blocks. At least one monitoring NAND string is formed in each block. The programming device programs memory cells that are connected to the selected word line. The reading device reads the memory cells that are connected to the selected word line. The programming device programs the memory cell of the monitoring NAND string at the same time that it programs the memory cells of the selected word line. When reading the memory cell of the selected word line n, the reading device detects whether the memory cell of the unselected word line n+1 of the monitoring NAND string is programmed. Based on the detecting result, the reading device determines the first offset voltage to be added to the reading pass voltage, and it determines the second offset voltage to be added to the read voltage. The reading device applies the reading pass voltage where the first offset voltage is added to the unselected word line, and it applies the read voltage where the second offset voltage is added to the selected word line n.

It is possible to compensate for the fluctuation of the threshold value when reading a selected word line, according to the present disclosure. This is true because the programed state of the memory cell of the adjacent unselected word line is detected, and because the read voltage is applied to the selected word line according to the detecting result. This is true even if the threshold value of the selected memory cell fluctuates due to the FG coupling with the adjacent memory cell. As a result, the data stored in the memory cell can be read accurately.

DETAILED DESCRIPTION OF THE INVENTION

Next, an embodiment of the present disclosure will be described in detail with reference to the drawings. The semiconductor memory device according to the present disclosure can be such as a NAND flash memory, or a microprocessor, a microcontroller, a logic, an ASIC, a processor that processes images and sounds, or a processor that processes wireless signal in which such a flash memory is embedded.

Figure 1:
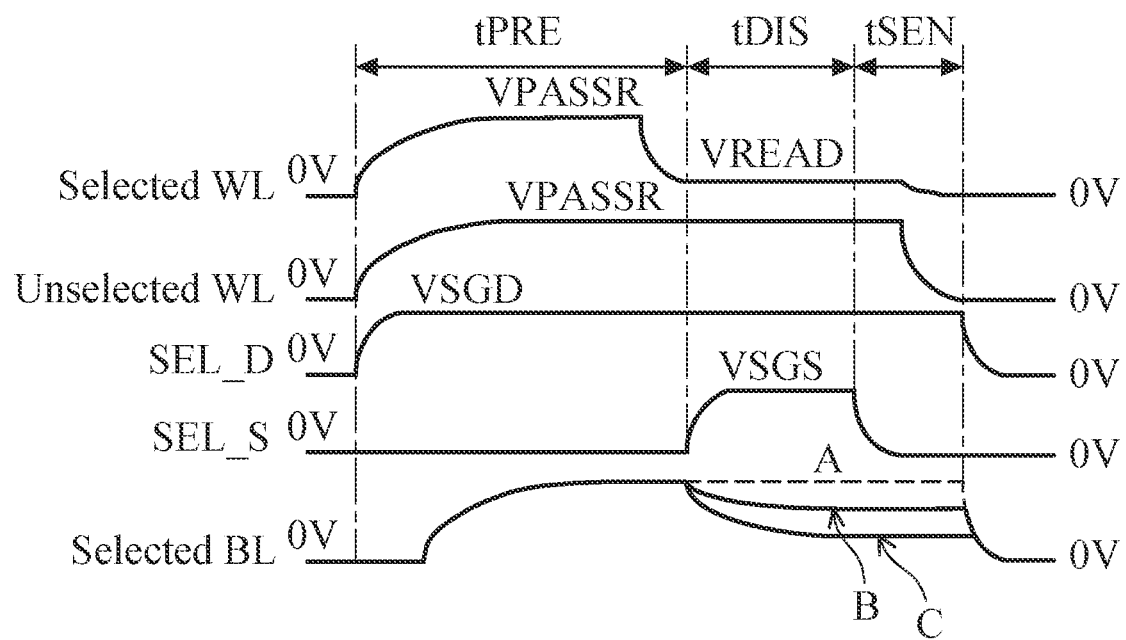
FIG. 1 is a time chart explaining the read operation of the conventional flash memory.
Figure 2:
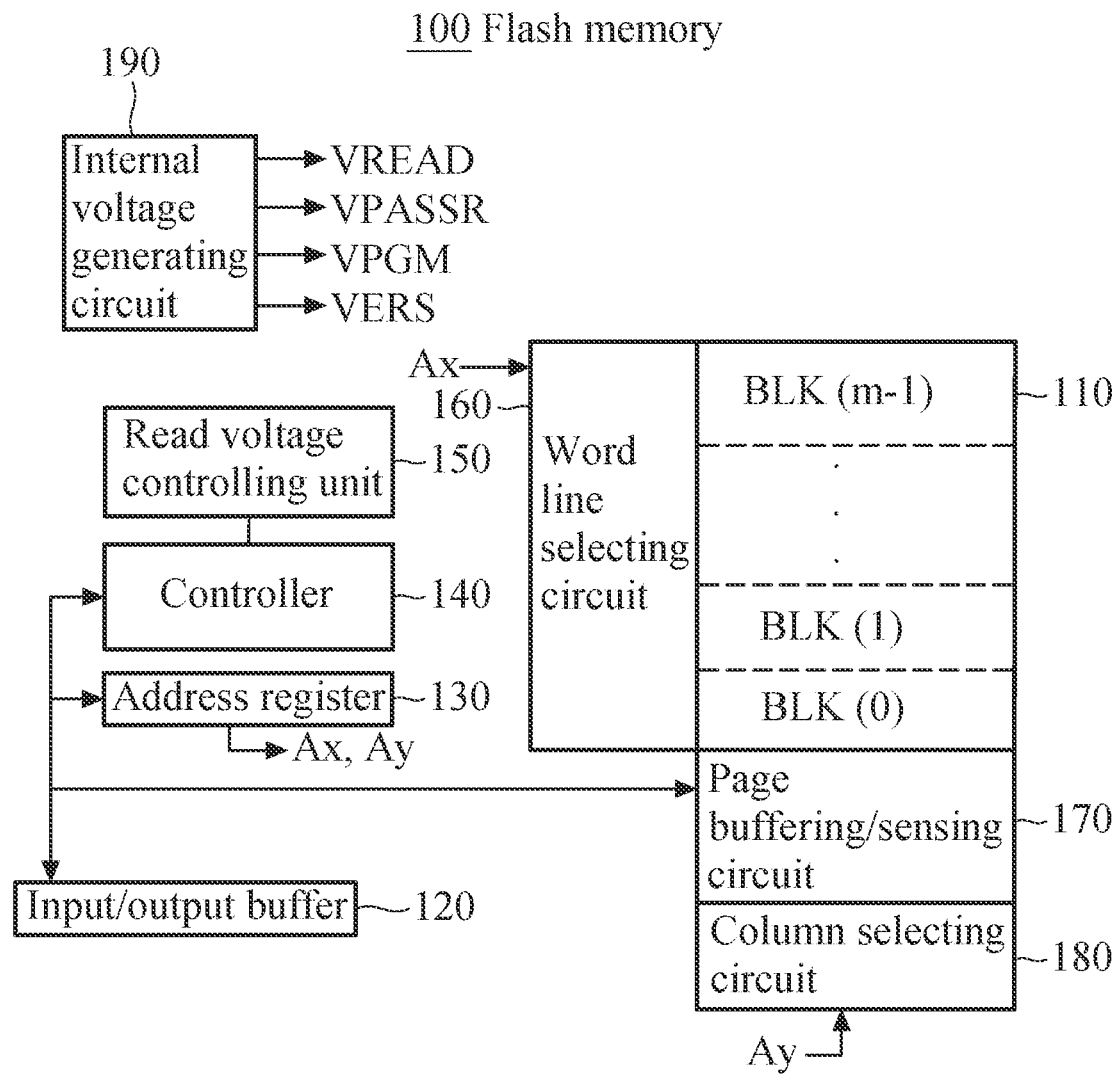
FIG. 2 is a block diagram which shows the structure of the flash memory according to an embodiment of the present disclosure.

FIG. 2 is a diagram showing an internal configuration of a NAND flash memory according to an embodiment of the present disclosure. The flash memory 100 according to the present embodiment comprises: a memory array 110, in which a plurality of memory cells are arranged in a matrix; an input/output buffer 120, which inputs/outputs data and so on; an address register 130, holding an address received via the input/output buffer 120; a controller 140, controlling each unit based on a command or the like received via the input/output buffer 120, a read voltage controlling unit 150, controlling the read voltage and the reading pass voltage applied to the selected word line and the unselected word line during the read operation; a word line selecting circuit 160, selecting a block or a word line and so on based on the decoding result of the row address Ax from the address register 130; a page buffering/sensing circuit 170, holding data read from the page selected by the word line selecting circuit 160, or holding data to be programmed into the selected page; a column selecting circuit 180, selecting columns in the page buffering/sensing circuit 170 based on the decoding result of the column address Ay from the address register 130; and an internal voltage generating circuit 190, generating various voltages (read voltage VREAD, reading pass voltage VPASSR, program voltage VPGM, erase voltage VERS, etc.) for reading, programming, erasing, and so on.

Figure 3A:
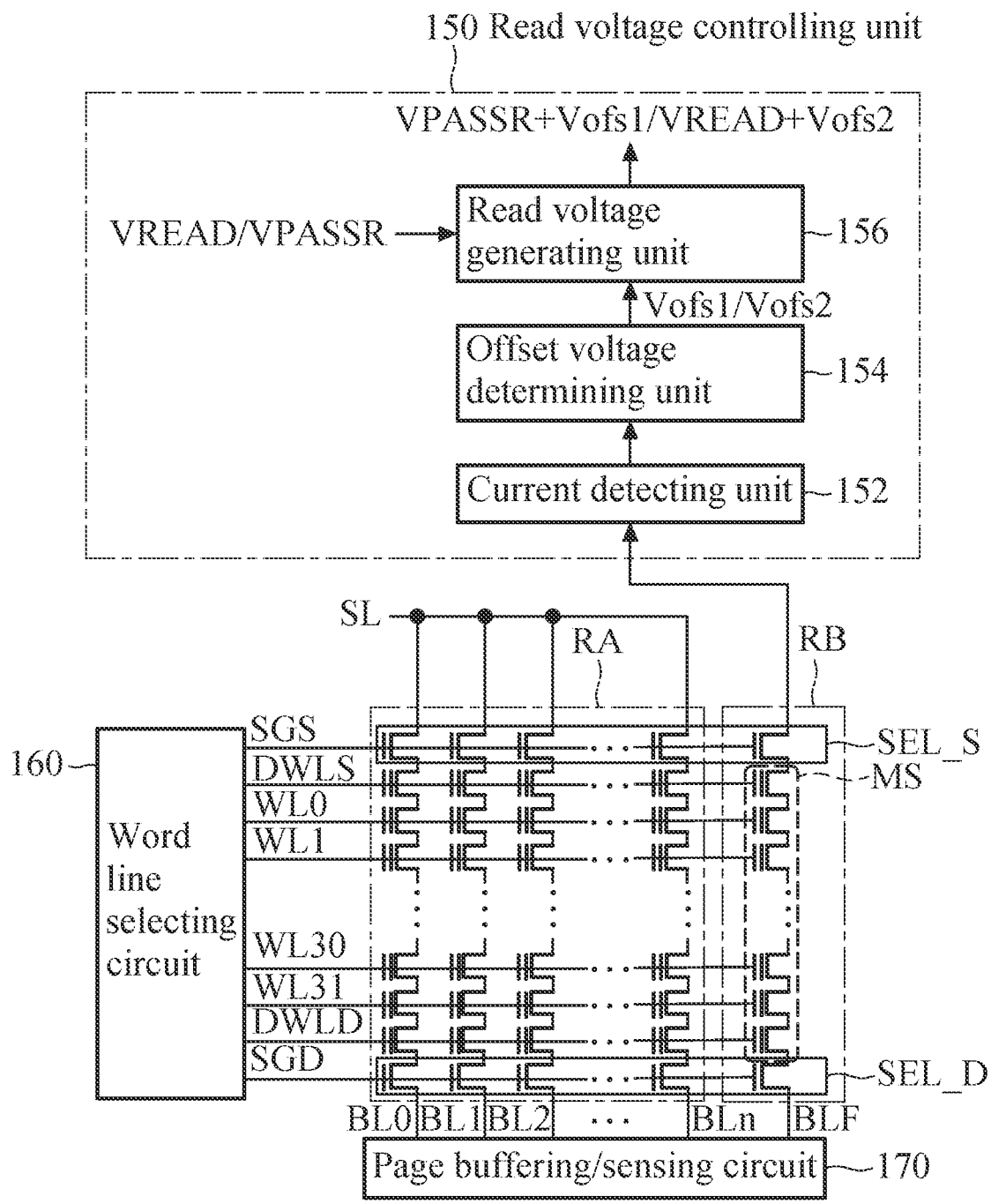
FIG. 3A shows a structure example of the monitoring NAND string and the read voltage control unit according to an embodiment of the present disclosure.

The memory cell array 110 comprises in blocks BLK (0), BLK (1), . . . , BLK (m−1). As shown in FIG. 3A, one block comprises one page of NAND strings formed in the user area. RA that can be used by users (or can be accessed by users), and at least one monitoring NAND string MS formed in a no user area RB that is not available by the user or inaccessible by the user). One NAND string formed in the user area RA comprises: a source line side selection transistor SEL_S whose gate is connected to the selection gate line SGS; a source line side dummy memory cell whose gate is connected to the dummy word line DWLS; 32 memory cells in which each gate is connected to word lines WL0, WL1, . . . , WL31; a bit line side dummy memory cell whose gate is connected to the dummy word lune DWLD; and a bit line side selection transistor SEL_D whose gate is connected to the selection gate line SGD. The dummy memory cells on the source line side and the bit line side may be either in the erased state or in the programmed state. These NAND strings are connected to the page buffering/sensing circuit 170 via bit lines BL0, BL1, BL2, . . . , BLn.

The monitoring NAND string MS formed in the non-user area RB is configured in the same manner as the NAND string formed in the user area RA, and the monitoring NAND string MS is connected to the page buffering/sensing circuit 170 via the bit line BLF. The monitoring NAND string MS is prepared to monitor whether the memory cell of the unselected word line adjacent to the selected word line s programmed during the read operation. In one embodiment, each memory cell of the monitoring NAND string MS is programmed at the same time as the pages of the block are programmed. For example, when programming the page of word line k, the memory cell of the word line k of the monitoring NAND string is programmed. Further, in one embodiment, the memory cells of the monitoring NAND string may be programmed according to the number of memory cells which is programmed in one page (the program s data that shifts the threshold value of the memory cells in the positive direction). For example, when programming the page of the word line k, if over a half of the memory cells of the page are programmed to be data "0", the memory cells of the word line k of the monitoring NAND string are programmed to be data "0"; otherwise, the data "0" is not programmed in the memory cell of the word line k of the monitoring NAND string. In this way, each memory cell of the monitoring NAND string MS largely reflects whether each word line is in the programmed state.

The memory cell array 110 may be formed two-dimensionally on the surface of the substrate or may be formed three-dimensionally in the direction perpendicular to the surface of the substrate. Furthermore, the memory cell may be an SLC type that stores one bit (binary data) or a type that stores multiple bits.

The controller 140 includes a state machine or a microcontroller that controls each operation of the flash memory. In the read operation, a certain positive voltage is applied to the bit line, a read voltage VREAD is applied to the selected word line, a reading pass voltage VPASSR is applied to the unselected word line, and the bit line side selection transistor and the source line side are turned on, 0V is applied to the source line. In the program operation, a program voltage VPGM which is a high voltage is applied to the selected word line, an intermediate electric potential is applied to the unselected word line, the bit line side selection transistor is turned on, the source line side selection transistor is turned off, and an electric potential corresponding to the data of "0" or "1" is supplied to the bit line. In the erasing operation, 0V is applied to all the selected word lines in the block, an erasing voltage VERS which is a high voltage is applied to the P well, the electrons of the floating gate are drawn out from the substrate, and the data is erased in block units.

As described above, when programming the selected page of the selected block, the controller 140 programs the memory cells corresponding to the selected page of the monitoring NAND string MS simultaneously. In some embodiments, the programming is performed in ascending order of the number of word line on the source line side of the selected block. For example, in the example of FIG. 3A, the programming is performed in order from the word line WL0.

When performing the read operation (including program verification), the controller 140 applies the read voltage VREAD and the reading pass voltage VPASSR controlled by the read voltage controlling unit 150 to the selected word line and the unselected word line. Under the control of the controller 140, the read voltage controlling unit 150 applies a read voltage VREAD to the unselected word line n+1 adjacent to the selected word line n during the precharge period of the read operation detect the current flowing through the monitoring NAND string MS, and determines the offset voltage to be applied to the read voltage VREAD and the reading pass voltage VPASSR according to the detected current.

When the threshold value Vt of the memory cell n of the selected word line n is shifted in positive direction due to FG coupling with the memory cell n+1 of the adjacent unselected word line n+1, by applying the read voltage VREAD, when the memory cell n is turned on, the current flowing through becomes small. Since a current reflecting the programmed state of the unselected word line n+1 flow through each memory cell of the monitoring NAND string MS, the programmed state of the unselected word line n+1 can be known by detecting the current.

Figure 3B:
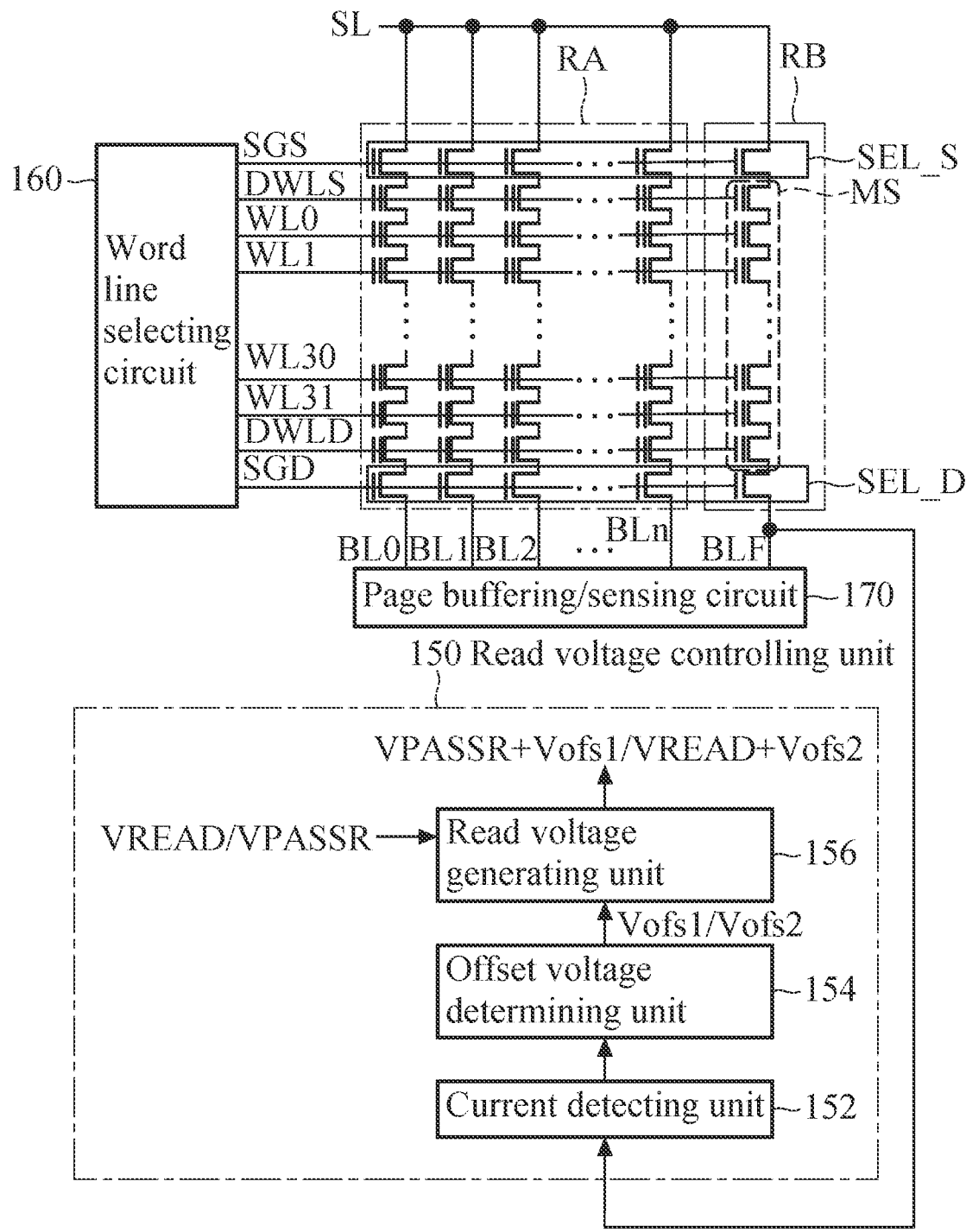
FIG. 3B shows another structure example of the monitoring NAND string and the read voltage control unit according to an embodiment of the present disclosure.

As shown in FIG. 3A, for example, the read voltage controlling unit 150 comprising: a current detecting unit 152, connected to the source line side of the monitoring NAND string MS and detects the current flowing through the monitoring NAND string; an offset voltage determining unit 154, determining the offset voltage Vofs1/Vofs2 based on the detected current, a read voltage generating unit 156, generating the reading pass voltage VPASSR+Vofs1 and the read voltage VREAD+Vofs2 based on the offset voltage Vofs1/Vofs2 determined by the offset voltage determining unit 154. In another embodiment, for example, the read voltage controlling unit 150 may be connected to the bit line side of the monitoring NAND string MS, as shown in FIG. 3B. The read voltage controlling unit 150 is composed of hardware and/or software.

When the current detecting unit 152 detects the current of the monitoring NAND string MS, the read voltage VREAD is applied to the unselected word line n+1 adjacent to the selected word line n, the reading pass voltage VPASSR is applied to the selected word line n, other unselected word lines and the dummy word line DWLS/DWLD, and the gate voltage VSGD/VSGS is applied to the bit line side selection transistor SEL_D and the source line side selection transistor SEL_S, and a voltage is applied to the bit line BLF connected to the monitoring NAND string MS. This voltage is the precharge voltage applied during the page buffering/sensing circuit 170 performing read operation, for example. As a result, the memory cell n+1 of the unselected word line n+1 of the monitoring NAND string MS is read, and if the memory cell n+1 is programmed, no current flows through the monitoring NAND string, and if the memory cell n+1 is not programmed, current will flow through the monitoring NAND string. In the case of the configuration shown in FIG. 3A, the current flowing from the bit line BLF is detected by the current detecting unit 152, and in the case of the configuration shown in FIG. 3B, the current flowing out toward the source line SL is detected by the current detecting unit 152.

The offset voltage determining unit 154 determines the offset voltage Vofs1/Vofs2 based on the detecting result of the current detecting unit 152. The offset voltage Vofs1 is a voltage added to the reading pass voltage VPASSR applied to the unselected word line during the discharge period (a part of the sensing period may be included), and the offset voltage Vofs2 is a voltage added to the read voltage VREAD applied to the selected word line during the discharge period (a part of the sensing period may be included).

In one embodiment, the offset voltage determining unit 154 determines that the memory cell n+1 of the unselected word line n+1 is in the programmed state when no current is detected by the current detecting unit 152. On the other hand, when current is detected by the current detecting unit 152, it is determined that the memory cell n+1 of the unselected word line n+1 is in the erased state. When it is determined that the memory cell n+1 is in the programmed state, the offset voltage determining unit 154 determines a predetermined offset voltage Vofs1/Vofs2. Although the determination method is optional, for example, a circuit that generates an offset voltage may be enabled, or a lookup table in which the offset voltage Vofs1/Vofs2 is set may be prepared, and the offset voltage determining unit 154 may determine the offset voltage Vofs1/Vofs2 with reference to this table. When the memory cell n+1 is in the erased state, the offset voltage Vofs1/Vofs2 is zero.

The read voltage generating unit 156 adds the offset voltage Vofs1/Vofs2 determined by the offset voltage determining unit 154 to the reading pass voltage VPASSR and the read voltage VREAD generated by the internal voltage generating circuit 190, generating the reading pass voltage VPASSR+Vofs1 and the read voltage VREAD Vofs2. The read voltage VREAD+Vofs2 is applied to the selected word line n, and the reading pass voltage VPASS+Vofs1 is applied to the unselected word line.

Figure 4:
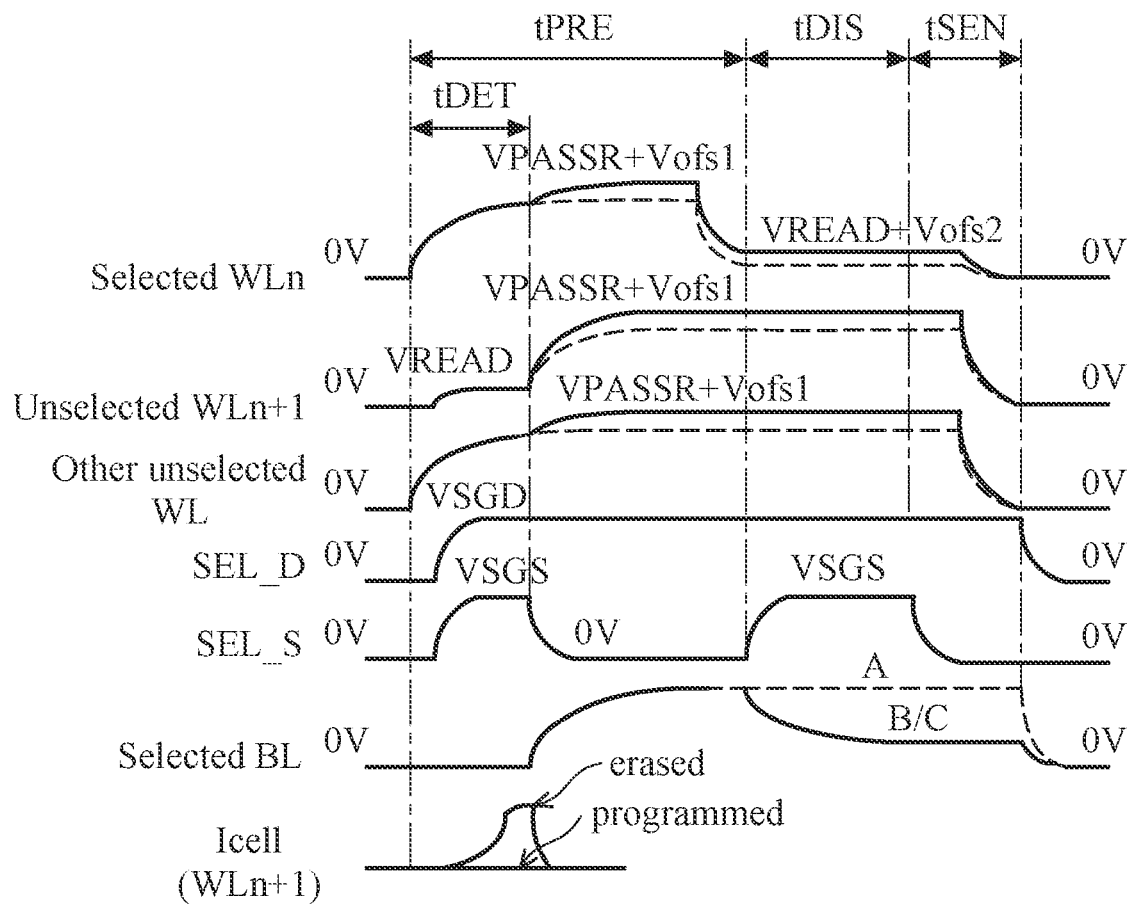
FIG. 4 is a time chart explaining the read operation of the flash memory according to an embodiment of the present disclosure.

Next, the operation of reading the flash memory of the present embodiment will be described with reference to the time chart of FIG. 4. When the controller 140 receives the read command and the address from the host device via the input/output buffer 120, the read operation is started. Here, it is assumed that the word line n is selected and the page of the word line n is read.

The precharge period tPRE includes the current detection period tDET, and the current flowing through the monitoring NAND string MS is detected contemporarily with the precharge of the bit line. In other words, the detection of the current is the reading of the memory cell n+1 of the unselected word line n+1 of the monitoring NAND string.

In the current detection period tDET, the word line selecting circuit 160 applies a read voltage (e.g., 0.2 V) to the unselected word line n+1 and applies a reading pass voltage VPASSR to the selected word line n and other unselected word lines. The reading pass voltage VPASSR is a voltage that conducts the memory cell regardless of the program of the memory cell, and is about 6.0 V, for example. The word line selecting circuit 160 further applies a gate voltage VSGD to conduct the bit line side selection transistor SEL_D, and a gate voltage VSGS having a certain pulse width is applied to conduct the source line side selection transistor SEL_S for a certain period.

Next, the page buffering/sensing circuit 170 applies a precharge voltage to the bit lines BL0, BL1, . . . , BLn, and BLF. In this way, the memory cell n+1 of the unselected word line n+1 of the monitoring NAND string MS is read, and the current flowing through the monitoring NAND string MS is detected by the current detecting unit 152. If the current flowing through the monitoring NAND string MS is not detected, the memory cell is in the programmed state, and if the current is detected, the memory cell is in the erased state. The offset voltage Vofs1/Vofs2 is determined based on this detection result.

When the current detection period tDET ends, the word line selecting circuit 160 sets the gate voltage of the source line side selection transistor SEL_S to 0V, and sets the source line side selection transistor SEL_S to be non-conducting. Furthermore, the word line selecting circuit 160 applies the reading pass voltage VPASSR+Vofs1 generated by the read voltage generating unit 156 to the selected word line n and all unselected word lines. When it is determined that the memory cell n+1 of the monitoring NAND string MS is being programmed, a voltage higher only by the offset voltage Vofs1 as compared with the conventional reading pass voltage VPASSR is applied. As a result, the memory cell n in the programmed state of which the threshold value Vt may have been shifted in the positive direction due to the FG coupling with the memory cell n+1 is strongly turned on, and the precharge voltage of the bit line and the NAND string is suppressed from falling below the expected voltage.

After precharging, the bit line and NAND string are discharged. In the discharge period tDIS, the word line selecting circuit 160 applies the read voltage VREAD+Vofs2 generated by the read voltage generating unit 156 to the selected word line, and applies the gate voltage VSGS to the source line side selection transistor SEL_S to make the source line side selection transistor SEL_S conductive. As a result, the NAND string in which the selected memory cell is in the programmed state holds the precharge voltage as it is (indicated by the broken line A), and the NAND string in which the selected memory cell is in the erased state discharges the precharge voltage to the source line SL. The solid line B shows the discharge potential of the NAND string and the bit line when the memory cell n+1 of the unselected word line n+1 is programmed, and the solid line C shows the discharge potential of the NAND string and the bit line when the memory cell n+1 of the unselected word line n+1 is not programmed.

In this embodiment, by applying the read voltage VREAD+Vofs2 to the selected word line n, even in the circumstance that the memory cell n whose threshold value Vt is shifted due to the FG coupling with the programmed memory cell n+1 of the unselected word line n+1, the memory cell n is strongly turned on as the offset voltage Vofs2 increases, the decrease in current is prevented. Therefore, the fluctuation of the threshold value Vt of the memory cell n is compensated, the discharge potential of the solid line B can be set to the same level as the discharge potential of the solid line C, and the decrease in the read margin is suppressed.

Next, during the sensing period tSEN, the page buffering/sensing circuit 170 senses the electric potential of the bit line, and determines whether the selected memory cell is in the programmed state (data "0") or the erased state (data "1"). Since the difference in read margin between the electric potential of the bit line including the programmed memory cell (broken line A) and the electric potential of the bit line including the memory cell in the erased state (solid line B/C) is sufficiently secured, it could prevent a memory cell in the erased state from being mistakenly determined as a memory cell in the program state.

In the above embodiment, although an example in that the current of the monitoring NAND string MS is detected during the precharge period of the read operation is shown, the timing of detecting the current is not necessarily limited to the precharge period, it is also feasible to perform the normal read operation of the selected word line n since the unselected word line n+1 of the monitoring NAND string MS is read.

In the above embodiment, an example that the current detecting unit 152 detects the current of the monitoring NAND string MS to determine whether the memory cell n+1 of the unselected word line n+1 of the monitoring NAND string MS is programmed is shown, however, not limited to it, whether the memory cell n+1 is programmed may be determined by detecting the voltage of the bit line BLF of the monitoring NAND string MS. In this case, although a voltage detecting unit instead of the current detecting unit 152 is required, the voltage detecting unit may be implemented in the sensing circuit of the page buffering/sensing circuit 170. The page buffer/sense circuit 170 reads the memory cell n+1 of the unselected word line n+1 of the monitoring NAND string MS in the same manner as when reading a normal page, and the bit line connected to the monitoring NAND string MS. When the page buffering/sensing circuit 170 reads the memory cell n+1 of the unselected word line n+1 of the monitoring NAND string MS in the same manner as reading a normal page, if the electric potential of the bit line BLF connected to the monitoring NAND string MS does not change, it is determined that the memory cell n+1 is programmed, and if the potential of the bit line BLF decreases, it can be determined that the memory cell n+1 is not programmed.

In the above embodiment, the page read operation of the memory cell array has been illustrated, but the reading method of this embodiment can be similarly applied to the reading of the program verification during the program operation. Furthermore, in the above embodiment, when reading the selected word line n, the read voltage/reading pass voltage is controlled according to the programmed state of the unselected word line n+1. Not limited to this, the present disclosure can control the read voltage/reading pass voltage according to the programmed state of the unselected word line n−1 when reading the selected word line n. Furthermore, it is also possible to control the read voltage/reading pass voltage according to the programmed states of both the unselected word line n+1 the unselected word line n−1. However, in order to detect the programmed state of the unselected word line n+1 and the unselected word line n−1, it is necessary to read the memory cell n−1 and the memory cell n−1 of the monitoring NAND string MS.

In the above embodiment, the presence of the current detected by the current detecting unit 152 to determine whether the memory cell of the unselected word line n+1 of the monitoring NAND string MS is programmed, however, the current detecting unit 152 may compare the detected current of the monitoring NAND string with the reference current, and determines that the memory cell is in the programmed state when the detected current<reference current, determines that the memory cell is in the erased state when the detection current≥reference current. In this case, the reference current is the current that flows through the erased memory cell whose threshold value Vt has not been shifted due to FG coupling according to the read voltage MEAD.

In the above embodiment, one monitoring NAND string is prepared, but a plurality of monitoring NAND strings may be prepared. For example, a part of memory cells of the monitoring NAND string are always programmed when the selected page is programmed, and other memory cells of the monitoring NAND string are programmed according to the number of memory cells in which the data "0" is programmed when the selected page is programmed (for example, programs when the number of memory cells to be programmed is more than half). A part of the monitoring NAND strings assume the worst case in which the memory cell of the selected word line n is shifted due to the FG coupling by the program of the unselected word line n+1 regardless of the number of memory cells being programmed in one page, in contrast, other monitoring strings assumes that the threshold Vt of the memory cells of the selected word line n does not shift due to FG coupling when the number of programmed memory cells of the unselected word line n+1 is less than half. As a result, the programmed state of the memory cell of the selected word line n+1 is reflected more accurately than in the worst case. The controller 140 can detect the current by selecting either a part of monitoring NAND strings or other monitoring NAND strings according to user settings or the like. Alternatively, the controller 140 may detect the currents of both of a part of the monitoring NAND strings and other monitoring NAND strings, compare the average value of them with the reference current, and determine the offset voltage Vofs1/Vofs2 based on the comparing result.

Next, a second embodiment of the present disclosure will be described, in the above embodiment, the page buffering/sensing circuit 170 uses a voltage detecting method for detecting the voltage of the bit line, while in the second embodiment, uses the current detecting method that detecting the current flowing through the bit line to determine the data "0" and "1" of the memory cell. As shown in FIG. 4, the voltage detecting method precharges the bit line and then discharges the precharged voltage, but the current detecting method does not require the steps of precharging and discharging because it only needs to sense the current flowing through the bit line.

For example, the sensing circuit of the current detecting method converts the current into a voltage by a cascade circuit to determine the data "0" and "1" of the memory cell, or compares the current flowing through the NAND string with the reference current to determine the data "0" and "1" of the memory cell. When a voltage detecting type sense circuit is used, shield reading is general in which one of a part of even-numbered bit lines and odd-numbered bit lines are selected and the other are set to GND in order to suppress noise by capacitance coupling between the bit lines, however, the sensing circuit of the current detecting method can select and read all bit lines at the same time.

Figure 5:
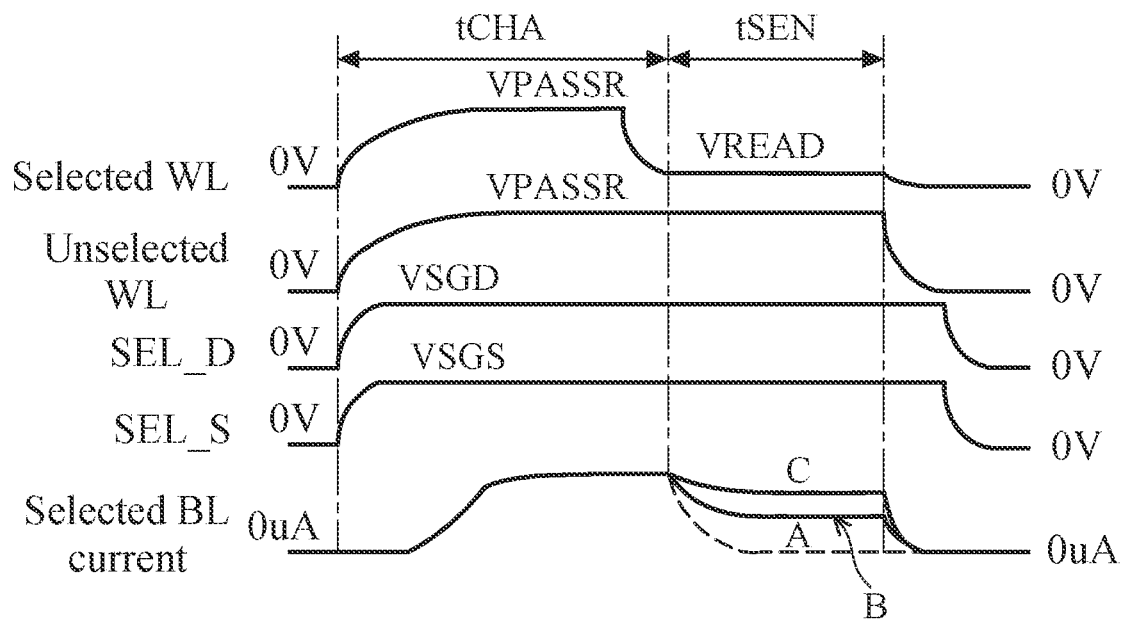
FIG. 5 is a time chart explaining the read operation of the flash memory according to the conventional current sensing method.

FIG. 5 is a time chart for explaining the read operation by the conventional current detecting method. In the charge period tCHA, the reading pass voltage VPASSR is applied to the selected word line and all unselected word lines, the bit line side selection transistor SEL_D is turned on by the gate voltage VSGD, and the source line side selection transistor SEL_S is turned on by the gate voltage VSGS, the page buffering/sensing circuit 170 transmits current to the bit lines and all NAND strings in the selected block.

Next, in the sensing period tSEN, a read voltage VREAD (for example, 0.2 V) is applied to the selected word line. When the selected memory cell is in the programmed slate, no current flows through the bit line because the NAND string is not conductive, and when the selected memory cell is in the erased state, a certain current flows through the bit line because the NAND string is conductive. Here, the broken line A indicates the current of the bit line when the selected memory cell is programmed, and the solid lines B and C indicate the current of the bit line when the selected memory cell is erased. The solid line B is the current flowing through the bit line when the threshold value Vt shifts in the positive direction due to FG coupling with the memory cell of the adjacent word line and the current flowing through the memory cell decreases. The solid line C is the current flowing through the bit line when the threshold value Vt does not fluctuate or fluctuates only a little due to FG coupling with the memory cell of the adjacent word line. In the case of the solid line B, the difference in the read margin from the broken line A becomes small, and mistaken determination of the read data of the memory cell may occur.

Figure 6:
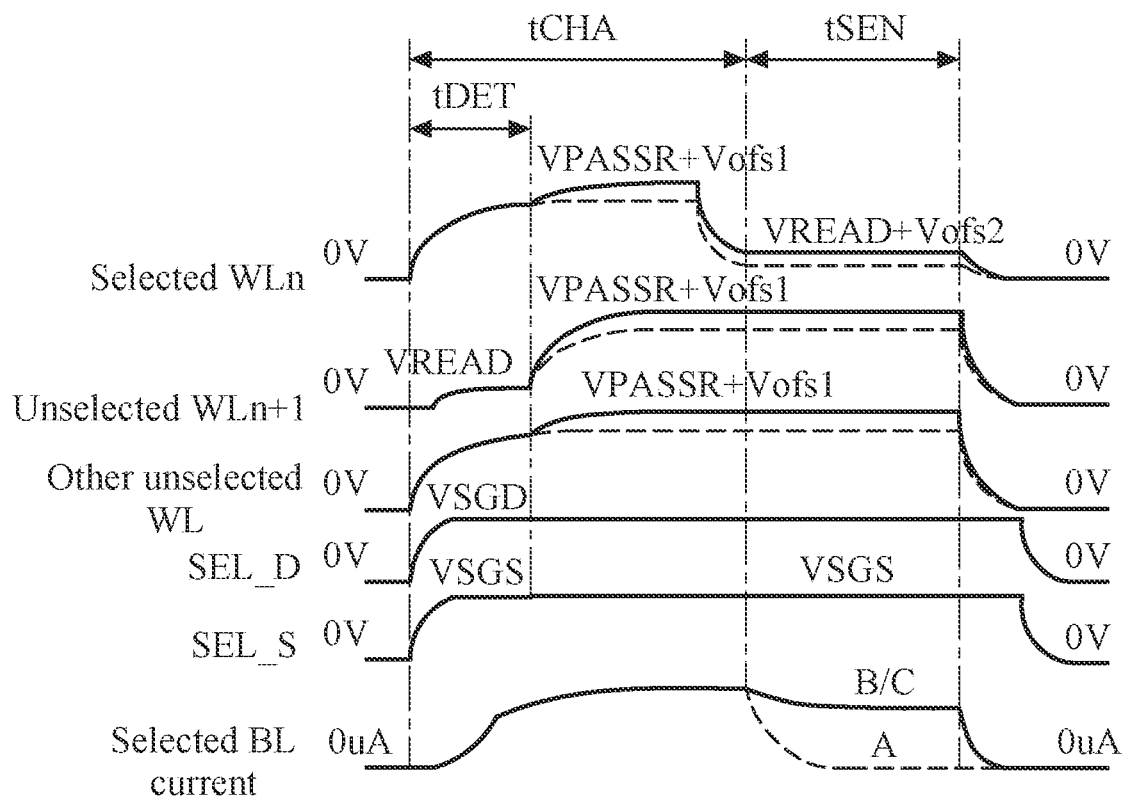
FIG. 6 is a time chart explaining the read operation of the flash memory by the current sense method according to another embodiment of the present disclosure.

FIG. 6 is a time chart illustrating a read operation of the current detecting method according to the second embodiment. In the case of this embodiment, during the charge period tCHA, first, the read voltage VREAD is applied to the unselected word line n+1 to perform reading the memory cell n+1 of the monitoring NAND string MS. The offset voltage Vofs1/Vofs2 is determined based on the current detected by the reading, and the determined offset voltage Vofs1/Vofs2 is applied to the reading pass voltage VPASSR and the read voltage VREAD almost in real time. In the sensing period tSEN, the current (solid line B) of the bit line including the erased memory cell n whose threshold value Vt is shifted due to FG coupling with the memory cell n+1 of the unselected word line n+1 becomes approximately equal to the current (solid line C) of the bit line including the memory cell in the erased state in which the threshold value Vt is not shifted by such FG coupling. Therefore, it is possible to maintain a constant read margin from the current (broken line A) of the bit line including the memory cell in the program state and suppress mistaken determination of the read data of the memory cell.

When the page buffer/sense circuit 170 uses the current detecting method of this embodiment, the current detecting unit 152 shown in FIGS. 3A and 3B is not indispensable, and the sensing circuit of the page buffering/sensing circuit 170 can perform the function of the current detecting unit 152.

As described above, although the preferred embodiments of the present disclosure have been described in detail, the present disclosure is not limited to the specific embodiments, and various modifications or alternatives can be made within the scope of the spirit of the present disclosure described in the claims.

What is claimed is:

1. A reading method for semiconductor memory devices, comprising:
    performing a first step to prepare at least one monitoring NAND string for each block of a NAND-type memory cell array;
    performing a second step to program a memory cell of the monitoring NAND string when programming a memory cell of a selected word line;
    performing a third step to detect whether the memory cell of an unselected word line n+1 of the monitoring NAND string is programmed when reading the memory cell of a selected word line n;
    performing a fourth step to determine a first offset voltage and a second offset voltage added to a reading pass and a read voltage respectively based on the detecting result of the third step; and
    performing a fifth step to apply the reading pass voltage where the first offset voltage is added to the unselected word line, and applying the read voltage where the second offset voltage is added to the selected word line n.

2. The reading method for semiconductor memory devices as claimed in claim 1, wherein performing the third step further comprises applying a read voltage to the unselected word line n+1, applying the reading pass voltage to the selected word line n and other unselected word lines, and detecting whether the memory cell of the monitoring NAND string is programmed.

3. The reading method for semiconductor memory devices as claimed in claim 1, wherein performing the third step further comprises detecting whether the memory cell is programmed by current flowing through the monitoring NAND string.

4. The reading method for semiconductor memory devices as claimed in claim 2, wherein performing the third step further comprises detecting whether the memory cell is programmed by current flowing through the monitoring NAND string.

5. The reading method for semiconductor memory devices as claimed in claim 1, wherein performing the third step further comprises detecting whether the memory cell is programmed by electric potential of the bit line to which the monitoring NAND string is connected.

6. The reading method for semiconductor memory devices as claimed in claim 1, wherein performing the second step further comprises programming the memory cells of the monitoring NAND string based on the number of programmed memory cells of the selected word line.

7. The reading method for semiconductor memory devices as claimed in claim 6, wherein performing the second step further comprises programming the memory cell of the monitoring NAND string when more than half of the memory cells of the selected word line are programmed.

8. The reading method for semiconductor memory devices as claimed in claim 1, wherein the third step is performed during the hit line precharge period of the bit line.

9. The reading method for semiconductor memory devices as claimed in claim 5, wherein the third step is performed during the hit line precharge period of the bit line.

10. The reading method for semiconductor memory devices as claimed in claim 1, wherein the programming of a page of the block is performed in ascending order of the number of the word lines while the number of word lines connected to each memory cell of the NAND string increases from the source line side to the bit line side.

11. The reading method for semiconductor memory devices as claimed in claim 1, wherein the monitoring NAND string is prepared in an area of the memory cell array that is not used by users or an area of the memory cell array that cannot be accessed by users.

12. A semiconductor memory device, comprising:
    a NAND-type memory cell array, comprising a plurality of blocks, wherein at least one monitoring NAND string is formed in each block;
    a programming device, configured to program memory cells connected to a selected word line; and
    a reading device, configured to read the memory cells connected to the selected word line; wherein
    the programming device programs the memory cells of the monitoring NAND string when programming the memory cells of the selected word line;
    the reading device detects whether the memory cell of an unselected word line n+1 of the monitoring NAND string is programmed when reading the memory cell of the selected word line n, and determines a first offset voltage and a second offset voltage added to a reading pass voltage and a read voltage respectively based on the detecting result, and applies the read pass voltage where the first offset voltage is added to the unselected word line, and applies the read voltage where the second offset voltage is added to the selected word line n.

13. The semiconductor memory device as claimed in claim 12, wherein the programming device programs the memory cells of the monitoring NAND string based on the number of programmed memory cells of the selected word line.

14. The semiconductor memory device as claimed in claim 12, wherein the reading device applies the read voltage to the unselected word line n+1, applies the reading pass voltage to the selected word line n and to other unselected word lines, and detects whether the memory cell of the monitoring NAND string is programmed.

15. The semiconductor memory device as claimed in claim 12, wherein the reading device comprises a page buffering sensing circuit, which detects the current flowing through the monitoring NAND string in order to determine whether the memory cell is programmed.

16. The semiconductor memory device as claimed in claim 12, wherein the reading device comprises a page buffering/sensing circuit, which detects the electric potential of a bit line to which the monitoring NAND string is connected in order to determine whether the memory cell is programmed.

17. The semiconductor memory device as claimed in claim 12, wherein the reading device detects whether the memory cell of the unselected word line n 1 of the monitoring NAND string is programmed during the precharge period of a bit line.

18. The semiconductor memory device as claimed in claim 12, wherein the programming device performs programming of a page in ascending order of the number of word lines while the number of word lines connected to each memory cell of the NAND string increases from the source line side to the bit line side.

* * * * *